United States Patent [19]

Kobayashi et al.

[11] Patent Number: 4,553,501
[45] Date of Patent: Nov. 19, 1985

[54] SELECTIVE PLATING APPARATUS

[75] Inventors: Hiroshi Kobayashi; Shinichi Muramatsu, both of Nagano; Yoshiro Ichikawa, Suzaka; Seizo Mitsui, Nagano, all of Japan

[73] Assignee: Shinko Electric Industries Co., Ltd., Nagano, Japan

[21] Appl. No.: 589,694

[22] Filed: Mar. 14, 1984

[51] Int. Cl.$^4$ .......................... B05C 3/15; B05C 3/18
[52] U.S. Cl. .................................... 118/669; 118/32; 118/33; 118/674; 118/406; 204/224 R
[58] Field of Search .................. 118/33, 32, 669, 674, 118/686, 687, 406; 427/172; 204/15, 203, 206, 207, 224 R, 275; 226/115, 117, 42, 44, 60, 61, 195

[56] References Cited

U.S. PATENT DOCUMENTS

| | | | |
|---|---|---|---|
| 3,724,733 | 4/1973 | Schaffer et al. | 226/44 |
| 3,913,900 | 10/1975 | Muster et al. | 226/44 |
| 3,974,056 | 8/1976 | Jogwick | 204/15 |
| 3,977,957 | 8/1976 | Kosowsky et al. | 204/15 |
| 4,011,976 | 3/1977 | Greer | 226/117 |

Primary Examiner—John P. McIntosh
Attorney, Agent, or Firm—Staas & Halsey

[57] ABSTRACT

An apparatus for selectively plating on an elongated metal strip, at intervals of a predetermined length in the lengthwise direction, while the strip is being fed in the lengthwise direction. The apparatus includes: strip feeder which discharges the strip from a reel in a direction in which the strip is fed and a sensor for detecting the amount of slack in the strip. A pre-treating station treats the strip, before being plated, while it is continuously fed. A plating station intermittently feeds the strip and selectively plates it, while the strip is stopped during its intermittent movement. An after-treating station treats the strip by again continuously feeding the strip and a strip take-up section winds the strip onto a reel after it has been treated. Tension mechanisms are disposed between the continuous feeding station and the intermittent feeding station to impart a predetermined tensile force to the strip. The continuous and intermittent movements of the strip are synchronized with each other by controlling the speed of the strip in the continuous feeding station.

8 Claims, 17 Drawing Figures

SELECTIVE PLATING APPARATUS

BACKGROUND OF THE INVENTION

1. Field of the Invention

The present invention relates to a selective or spot plating apparatus, hereinafter referred to as "selective plating apparatus", and more particularly to such an apparatus for plating onto an elongated strip of metal, hereinafter referred to as "strip", in a predetermined interval in the lengthwise direction thereof. The selective plating apparatus of this type can be advantageously employed for plating onto required portions of the segments of a strip, on which a number of the segments are continuously formed by stamping the strip in the lengthwise direction, such as a lead frame that is used for the manufacture of semiconductor devices, for example, IC's and LSI's.

2. Description of the Prior Art

When plating a strip such as a lead frame, particularly when being selectively plated, a pre-treatment process must first be performed to wash the surface of the strip in order to remove oils, oxide or contaminants. After the plating has been finished, furthermore, an after-treatment process must be performed to wash away the plating solution residing on the strip and then dry the strip. If the series of processes, i.e., pre-treatment process, selective plating process, and after-treatment process are to be continuously carried out while the strip is moved in the lengthwise direction, it is preferable that the strip be fed continuously in the pre-treatment station, intermittently in the selective plating station, and continuously in the after-treatment station. The reason for this is that, when selective plating, the strip must be stopped, because the plating is effected by masking the portions which are not be plated, supplying solution onto exposed preselected portions to be plated and supplying an electric current for a predetermined period of time. However, in the pre-treatment and after-treatment processes, continuously feeding the strip should be better than intermittently feeding it, in order that the surface of the strip be uniformly treated. Thus, in a line in which both continuous and intermittent feeding sections cooperatively exist together, the speed for feeding the strip must be in synchronism between the continuous and intermittent feeding sections, and it is desirable to apply a predetermined tension to the strip.

The strip is delivered from a discharge section, in which the strip is wound on a reel. If a strip having a small thickness such as a lead frame is pulled with a strong force, strip deformation, will occur. Usually, therefore, the strip should be slack for a required length between the strip discharge section and the pre-treatment station for plating. It is therefore necessary to bring the delivery speed at the strip discharge section into synchronism with the continuous feeding speed of the strip in the pre-treatment station.

With regard to the process of selectively plating in which the strip is intermittently fed, the plating can only be effected when the strip remains stationary. It is desirable, therefore, the number of portions to be selectively plated in a single plating operation should be as many as possible, or the time required for one cycle of plating should be as short as possible.

SUMMARY OF THE INVENTION

A primary object of the present invention is to solve the above-mentioned problems inherent in a selective plating apparatus for selectively plating onto a predetermined length of strip while feeding the strip intermittently in the lengthwise direction thereof.

Another object of the present invention is to smoothly supply the strip by forming a slack portion between a strip discharge section or a strip take-up station in which the strip is unwound from or wound onto a reel, and a pre-treatment station or an after-treatment station where the strip is continuously fed, and synchronize the strip unwinding or winding speed in the strip or take-up section with the speed of the continuously fed strip in the pre-treatment or after-treatment station.

A further object of the present invention is to synchronize the speed in the continuous feeding station with the speed in the intermittent feeding station, when the continuous feeding station and intermittent feeding station are used, on one processing line, and to maintain the tensile force, exerted on the strip, constant.

A still further object of the present invention is to plate, in a period of time as short as possible, i.e., at a speed as fast as possible, a strip which is selectively plated at certain intervals along its lengthwise direction.

To achieve the above-mentioned objects, the present invention provides an apparatus for selectively plating an elongated metal strip, at intervals of a predetermined length in the lengthwise direction thereof, while the strip is being fed in the lengthwise direction thereof. The selective plating apparatus includes a strip feeder for delivering the strip from a reel in a direction in which the strip is to be fed. Following the feeder are a pre-treating station for treating the strip, before being plated, while it is continuously fed. The plating is then performed by a plating station for selectively plating on the strip while the strip is stopped during its intermittent movement. Following the plating station are an after-treating station for treating the strip, after being plated, while it is again continuously fed and a strip take-up section for winding up the strip after it has been treated. A device for converting the continuous strip feeding to intermittent strip feeding, or vice versa, is provided to synchronize the intermittent and continuous strip feeding. Tension mechanisms disposed between the continuous and intermittent feeding stations impart a predetermined tensile force to the strip by passing it via at least one fixed roller and at least one tension roller. A device synchronizes the continuous and intermittent movements of the strip with each other by detecting the position of said tension roller.

DETAILED DESCRIPTION OF THE PREFERRED EMBODIMENTS

Embodiments of the invention will be described below with reference to the accompanying drawings. The embodiments deal with the case of an elongated strip-like metal material (strip), i.e., a lead frame which is used for manufacturing semiconductor devices such as IC's LSI's and the like.

Figure 1:
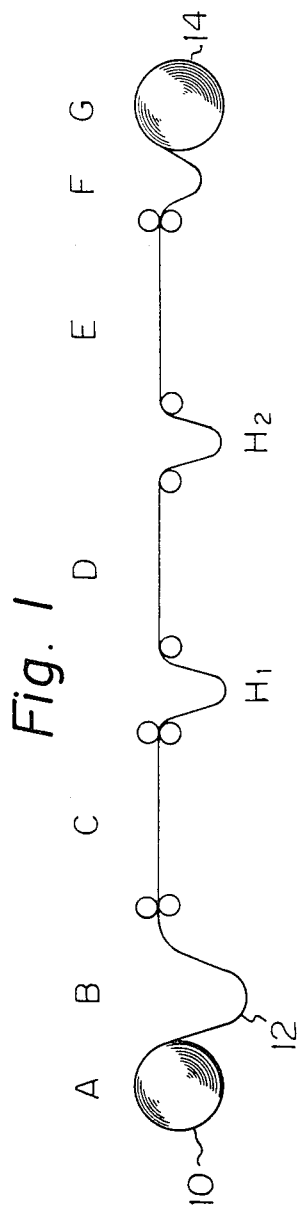
FIG. 1 is a diagram which schematically illustrates the steps in a selective plating apparatus according to the present invention.

FIG. 1 is a diagram which schematically illustrates the steps in a selective plating apparatus of the present invention, in which symbol A denotes a strip discharge section for delivering a strip 12 that is wound on a reel 10; B denotes a slackening section of the strip 12; C denotes a station for pre-treating the strip 12 where the surface of the strip 12 is washed to remove oil, oxide or contaminants; D denotes a station where selective plating is conducted on the strip 12; E denotes a station for after-treating the strip 12 where the plating solution residing on the strip 12 is washed away and then the strip 12 is dried; F denotes a slackening section like the slackening section B; and G denotes a strip take up section where the strip 12 is wound on a reel 14.

Figure 2:
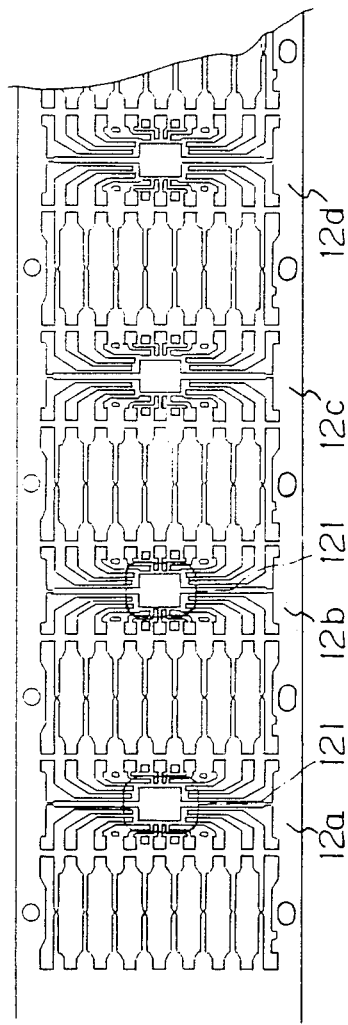
FIG. 2 is a plan view of an elongated metal strip which constitutes a lead frame.

The strip 12 consists of a lead frame as illustrated in FIG. 2, and has a number of segments 12a, 12b, —of the same shape that are formed by stamping and are continuously connected in the lengthwise direction. Selective plating or spot plating of gold, silver, or the like is effected onto the central portion of each segment, i.e., onto a die and wire-bonding area 121 where a semiconductor chip (not shown) is mounted and wires thereof are bonded, while the strip 12 remains stationary in the selective plating station D. In the selective plating station D, the strip 12 is fed intermittently, while in the pre-treating station C as well as in the after-treating station E, the strip 12 is fed continuously. Between the intermittent feeding station D and the continous feeding stations C and E, there are provided tension mechanisms $H_1$, $H_2$ which compensate the feed of strip 12 in the lengthwise direction and which maintain constant the tensile force imparted to the strip 12 in the continuous feeding stations C and E.

Figure 3:
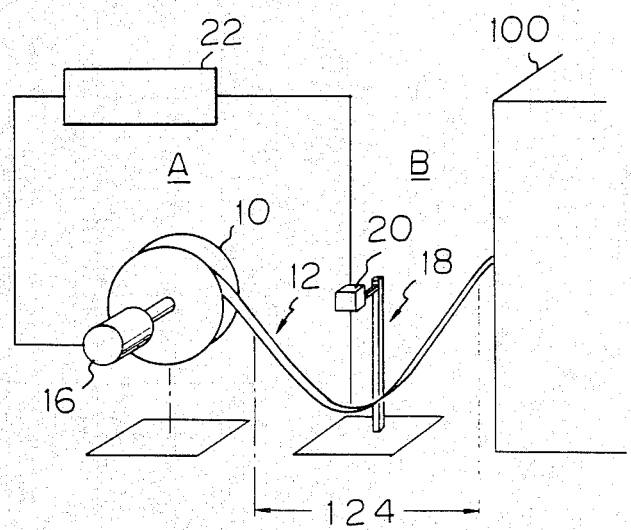
FIG. 3 is a perspective view of a strip discharge section and a slacking section of the strip.

FIG. 3 is a perspective view which schematically illustrates the strip discharge section A and the strip slackening section B. The strip discharge section A includes a reel 10 that is rotated by a drive motor 16. The strip 12 is delivered from the reel 10 which is driven by the drive motor 16 to form a slackened portion 124, and is continuously fed to the pre-treating station C (FIG. 1) of the plating apparatus. A height detector 18 is disposed in the slackening section B to maintain the height of the strip 12 within a predetermined range.

The height detector 18 includes a sensor 20 of the non-contacting type installed at a predetermined position with respect to the strip feeding direction. The sensor 20 measures the height of the strip that passes beneath it. Namely, the sensor 20 measures a distance from the sensor 20 to the strip 12 in a vertical direction by a conventionally known method, and sends a measured value in the form of peak-wave analog signals indicated by $S_1$ in FIG. 5 to a height detector circuit 22.

Figure 4:
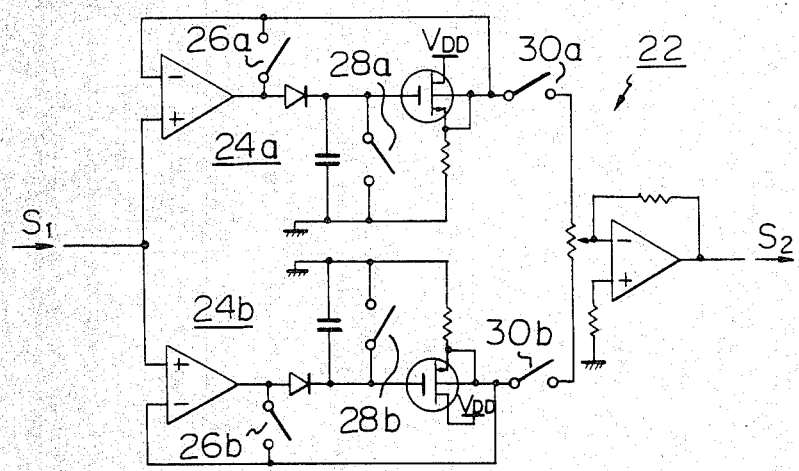
FIG. 4 is a diagram of an embodiment of a detector circuit for detecting the slack or height of the strip.
Figure 5:
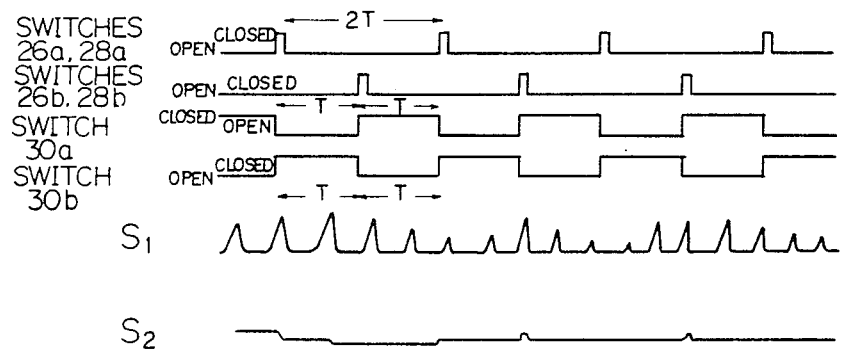
FIG. 5 is a diagram illustrating the signal waveforms of the height detector circuit in FIG. 4.

FIG. 4 illustrates the height detector circuit 22. The output $S_1$ of the sensor 20 is input to two peak-holding circuits 24a and 24b that are arranged in parallel with each other, and that are provided with switches 26a and 26b; 28a and 28b; and 30a and 30b, respectively. These switches 26a to 30b are opened and closed after every predetermined period 2T as illustrated in FIG. 5. That is, the switches 26a and 28a are simultaneously closed for a short period of time with a period of 2T. The switches 26b and 28b are also closed simultaneously for a short period of time with a period of 2T, but with a time difference of period T relative to the switches 26a and 28a. The switches 30a and 30b are opened for theperiod of time T from the closing of the switches 26a and 28a, and 26b and 28b, respectively, and are then closed for the period of time T. With respect to the switches 30a and 30b, therefore, the circuit 22 is opened and closed alternately with the predetermined period of time 2T. Due to these switches 26a, 28a, 26b and 28b, which open and close as described above, peaks of the peak-wave signals $S_1$ are successively held, maintaining a time difference by the peak-holding circuits 24a and 24b. Outputs of the peak-holding circuits 24a and 24b, which hold the peaks, are selectively switched by the pair of switches 30a and 30b. Therefore, the height detector circuit 22 produces signals of waveforms as denoted by $S_2$ in FIG. 5.

The motor 16 (FIG. 3) for driving the reel 10 is driven at a speed proportional to an embodiment of the signal waveforms $S_2$ that are obtained by the height detector circuit 22, or is driven under a more stable condition via a circuit (not shown) which imparts hysteresis characteristics to the waveforms $S_2$. The sensor 20 directly detects the strip 12 which is a lead frame having a number of holes formed by stamping. Therefore, the peak-wave analog signals $S_1$ are very unstable and undergo great change. Through the height detector circuit 22 having peak-holding circuits 24a and 24b, however, the peak-wave analog signals $S_1$ are converted into signals $S_2$ of stable waveforms. The drive motor 16 is controlled by using these signals $S_2$ or by using signals (not shown) to which hysteresis characteristics have been imparted, such that the strip 12 maintains the height (slackened condition) within a predetermined range in the slackening section B (FIG. 3) in relation to the feeding speed of the plating apparatus 100. Here, the predetermined period of time T is longer than a time which is required for feeding one segment 12a, 12b, . . . (FIG. 2) of the strip (lead frame) 12. Within this period of time T, a peak-wave signal $S_1$ having a peak nearly proportional to the slackening amount of the lead frame is obtained.

When the strip 12 does not consist of the lead frame but has a flat surface without holes, recesses or protuberances, the time T can be shortened in order to enhance the response to detection. Such a slackening (height) detector described above can also be employed in the slackening portion F and in the strip take-up section G of FIG. 1.

Owing to the height detector 18, the speed for delivering the strip 12 in the strip discharge section A is controlled to match the speed for continuously feeding the strip in the pre-treating station C (FIG. 1) in the plating apparatus 100, and the slacking amount is always maintained to lie within a predetermined range. Accordingly, the strip 12 is not affected by the inertial force of the reel 10, and is not forcibly pulled, either.

Described below will be tension mechanisms $H_1$ and $H_2$ installed between the continuous feeding stations C and E (FIG. 1), and the intermittent feeding station D (FIG. 1) with reference to FIGS. 6 to 12. The tension mechanisms $H_1$ and $H_2$ have the same construction, and only one of them will be illustrated below.

Figure 6:
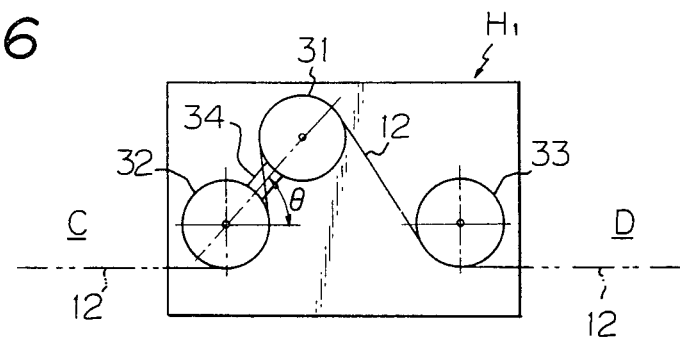
FIG. 6 is a plan view of an embodiment of the tension mechanism.
Figure 7:
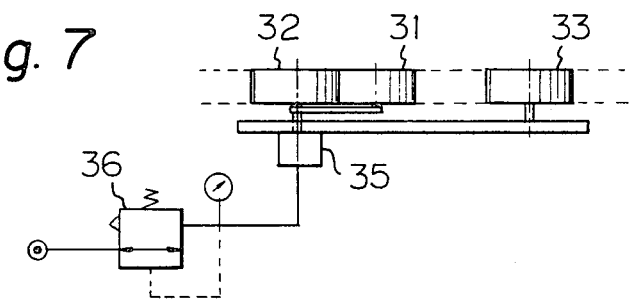
FIG. 7 is a side view of the tension mechanism illustrated in FIG. 6.

FIGS. 6 and 7 illustrate a first embodiment of the tension mechanism in which reference numerals 31 to 33 denote rollers which are made of a resin to reduce their weight, and 34 denotes an arm for linking the rollers 31 and 32 together. Shafts of the rollers 32 and 33 are secured to a base plate, and the roller 31 is rotatably mounted on a free end of the arm 34 which is allowed to pivot on the shaft of roller 32. The end of the arm 34 on the side of the roller 32 is directly coupled to a pneumatic swing actuater 35 which is supplied with a predetermined pneumatic pressure via a pressure control valve 36. With thus constructed tension mechanism, the arm 34 produces a predetermined torque, and the roller 31 mounted on the arm 34 imparts a tension to the strip 12 that runs via the rollers 32, 31 and 33.

The tension imparted to the strip 12 changes depending upon the swing angle $\theta$ of the arm 34. However, it has been confirmed through calculation that the tension can be maintained nearly constant by suitably selecting the diameter of the roller 31, the length of the arm 34 and the distance between the roller 32 and the roller 33, and by restricting the swing angle $\theta$ within a predetermined range.

Under the condition in which the roller 31 has a diameter of 267 mm, the arm 34 has a length of 300 mm, and the distance between the rollers 32 and 33 is 600 mm, a torque of 0.75 kg applied to the arm 34 produces various tensile forces as follows: a tensile force of 1.40 kg when the swing angle $\theta$ is 0°, 1.32 kg when $\theta$ is 20°, 1.36 kg when $\theta$ is 40°, 1.43 kg when $\theta$ is 60°.

Figure 8:
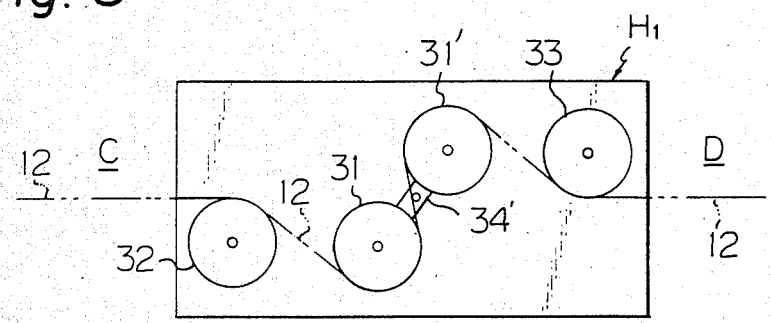
FIG. 8 is a plan view of a second embodiment of the tension mechanism.
Figure 9:
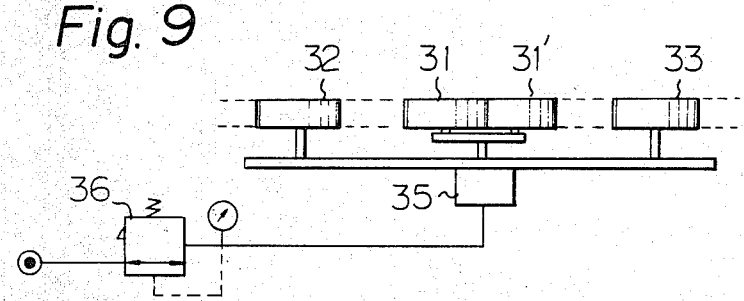
FIG. 9 is a side view of the tension mechanism illustrated in FIG. 8.

FIGS. 8 and 9 illustrate a second embodiment of the tension mechanism, in which rollers 31 and 31' are linked together by an arm 34' having a central axis directly coupled to the pneumatic swing actuator 35. Therefore, the rollers 31 and 31' swing about the central point of the arm 34' to give tension to the strip 12 which runs via the rollers 32, 31, 31' and 33. The second embodiment is has an advantage over the first embodiment, if the intermittent movement requires a long stroke.

Figure 10:
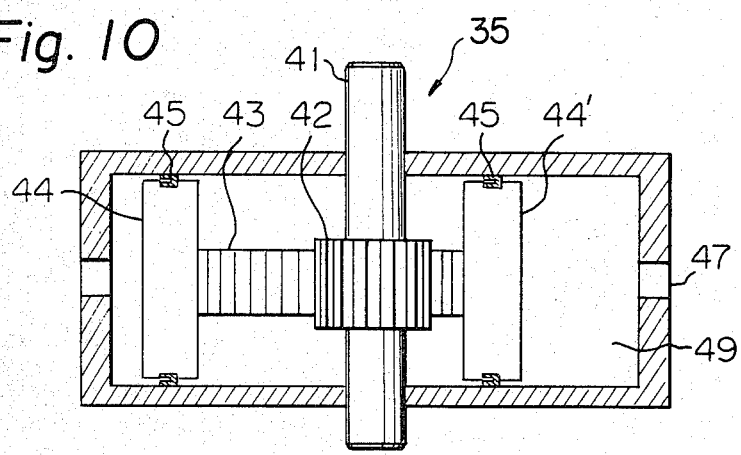
FIG. 10 is a sectional view of an actuator for swinging the arm.

FIG. 10 is a sectional view of the actuator 35 which may be employed in the tension mechanism H, or $H_2$ of the first and second embodiments. In FIG. 10, reference numeral 41 denotes a rotary shaft, 42 denotes a pinion, 43 denotes a rack, 44 and 44' denote pistons, and 45 denotes packings. When the pressure is introduced through the air inlet port 47, the pressure in a cylinder 49 is increased to push the piston 44'. The rack 43 coupled to the piston 44' moves leftwards. Then, the pinion 42, engaged with the rack 43, causes the shaft 41 coupled to the arms 34 and 34' (FIGS. 6 to 9) to rotate.

Figure 11:
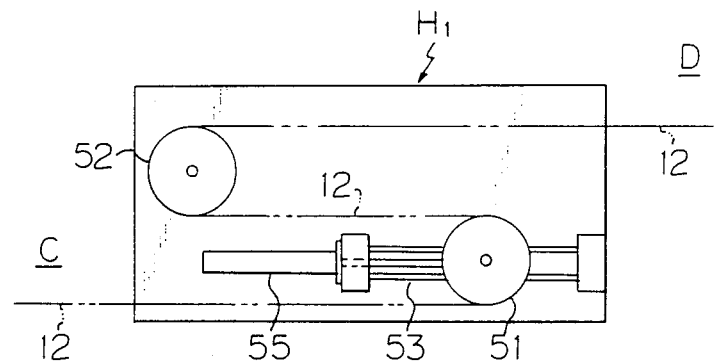
FIG. 11 is a plan view of a third embodiment of the tension mechanism.
Figure 12:
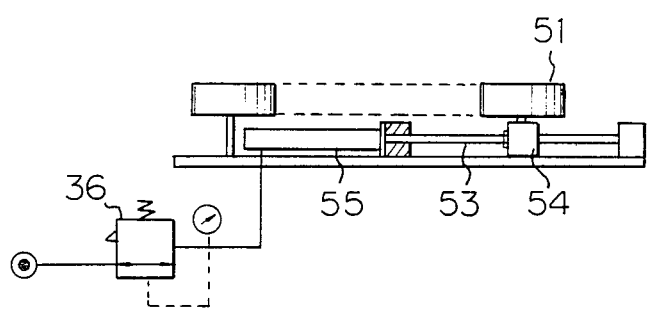
FIG. 12 is a side view of the tension mechanism illustrated in FIG. 11.

FIGS. 11 and 12 illustrate a third embodiment of the tension mechanism, in which the shaft of a tension roller 51 is secured on a slider 54 that is allowed to slidably move on a guide shaft 53. The slider 54 is always rightwardly urged by a pneumatic cylinder 55 to which a predetermined pressure is supplied via a pressure control valve 36. Therefore, a constant tension is supplied by the tension roller 51 to the strip 12 which runs through the tension roller 51 and a fixed roller 52. Although the mechanism of the third embodiment requires increased space, it does not perform the swinging motion of the first and second embodiments, and therefore, produces little deviation in tensile force. In place of the above-mentioned rack and pinion-type pneumatic swing actuator, any other type of tension imparting device can be employed, such as a vane-type actuator having a rotatable shaft integral with vanes which slidingly move inside of a body.

By employing the above-described tension mechanisms $H_1$, $H_2$ which utilize the pneumatic pressure, the strip 12 is allowed to feed continously through the continuous feeding stations C and E (FIG. 1) even when the strip 12 stops in the intermittent feeding station D (FIG. 1), such as at a plating portion, and yet a nearly constant tensile force is imparted to the strip 12. Further, using pneumatic pressure makes it possible to minimize the inertial mass of the tension mechanisms $H_1$ and $H_2$ and, hence, to operate them at high speeds. Moreover, the tensile force can easily be changed from the outside by the pressure control valve 36.

Figure 13:
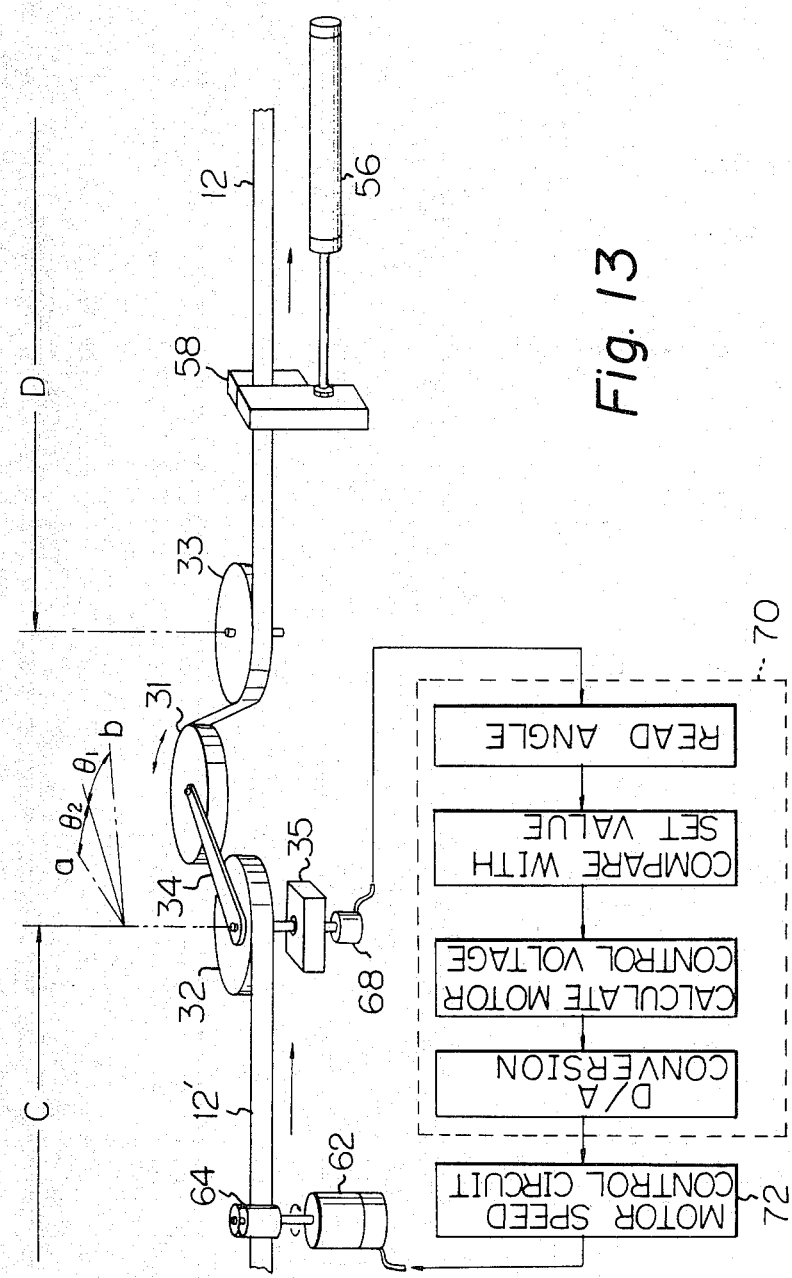
FIG. 13 is a schematic illustration of a device which performs feedback synchronization between the speed in the continuous feeding station and the speed in the intermittent feeding station.

Now, a device for synchronizing the strip speed in the continuous feeding station C with the strip speed in the intermittent feeding station D will be explained with reference to FIG. 13, in which a synchronizing device is attached to the tension mechanism illustrated in FIGS. 6 and 7. In the continuous feeding station C, the strip 12' is continuously driven by a motor 62 and a roller 64. In the intermittent feeding station D, on the other hand, the strip 12 is intermittently driven with a predetermined constant stroke by a catch device 58 which is reciprocally moved by a pneumatic cylinder 56. The slack of the strip 12 due to the speed difference thereof between the continuous feeding station C and the intermittent feeding station D is compensated by a tension roller 31 located between the rollers 32 and 33. As mentioned above, the tension roller 31 is rotatably mounted on an arm 34 that is urged in one direction by the actuator 35, and a rotary encoder 68 is provided at the bearing portion about which the arm 34 swings. Therefore, the arm 34 and the tension roller 31 perform a swinging motion to compensate the slack or speed difference. The rotary encoder 68 detects the swing angle of the arm 34 and sends the signals to a speed controller 70, such that the driving speed of the motor 62 is controlled by feedback by a motor speed control circuit 72.

If the strip speed caused by the motor 62 in the continuous feeding station C is denoted by v (m/sec), the time interval of the intermittent strip feeding by t (sec), and the length of the intermittent strip feeding stroke by l (m), the condition for synchronizing the continuous strip feeding speed is given by the following relation:

$$v = l/t$$

Now, if the center position of the swinging motion of the tension roller 31 is suitably determined, if a maximum swing angle in the clockwise direction relative to the center position is denoted by $\theta_1$, and if a maximum swing angle in the counterclockwise direction by $\theta_2$, relations relative to the feeding speed are given as follows:

$$\text{If } \theta_1 \leqq \theta_2 \ v > \frac{l}{t}$$

$$\text{If } \theta_1 = \theta_2 \ v = \frac{l}{t}$$

$$\text{If } \theta_1 \geqq \theta_2 \ v < \frac{l}{t}$$

Therefore, the angles $\theta_1$ and $\theta_2$ are measured by the rotary encoder 68 in order to determine the difference between the continuous feeding speed of the strip 12 and the intermittent feeding speed thereof. Then, the continuous feeding speed of the strip 12 is adjusted so that the center of the swinging motion of the tension roller 31 or the arm 34 comes to a predetermined position, thereby attaining the synchronized condition.

It is also possible to detect an extremity (a) of the swinging motion of the tension roller 31, and syncronize the continuous feeding speed of the strip 12 with the intermittent feeding speed thereof by reducing the continuous feeding speed if the detected extremity (a) is positioned outside of the predetermined extremity, and by increasing the continuous feeding speed if the detected extremity (a) is positioned inside of the predetermined extremity. Of course, it is also possible to detect another extremity (b) and effect the syncronization in a similar manner.

By using such a synchronizing device, the feeding speed in the continuous feeding station C and the feeding speed in the intermittent feeding station D can be automatically brought into synchronism with each other. The above-mentioned synchronizing device can also be employed between the plating station D and the after-treatment station E of FIG. 1. Further, this synchronizing device can, of course, be applied to the tension mechanism illustrated in FIGS. 8 and 9. In case of the tension mechanism as illustrated in FIG. 11, instead of detecting the swinging angle of the arm 34 of tension roller 31 by a rotary encoder 68 as illustrated in FIG. 13, the position of the tension roller 51 is detected by a linear encoder (not shown), and the continuous feeding speed is controlled so that the position of the tension roller 51 comes to a predetermined position, thereby attaining the synchronized condition.

Operation of selective plating in the intermittently feeding station D (FIG. 1) will be described below with reference to FIGS. 14 to 17, in which reference numeral 12 denotes the strip; 80 and 80' denote plating heads, 82 and 82' denote back-up plates for the plating heads; 84 and 84' denote adjusting screws; 86 denotes a pilot pin; 88 denotes a mechanism for intermittently feeding the strip 12; and 90 denotes a stroke-adjusting screw.

Figure 14:
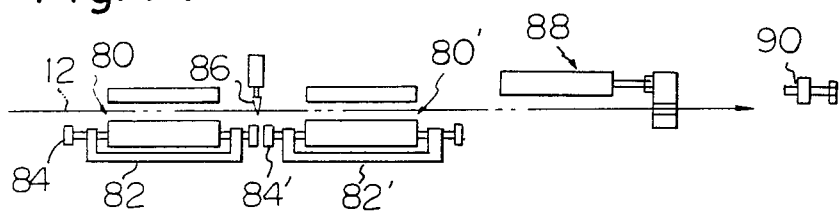
FIG. 14 is a schematic diagram illustrating a first embodiment of the arrangement of plating heads.

In FIG. 14, the plating heads 80 and 80' having the same length are arranged in tandem in the lengthwise direction. Each plating head performs the selective plating onto a certain number of segments (in this case, we show four segments for explanation) of the strip 12 at the same time in one cycle. The strip 12 is therefore fed by a stroke which corresponds to the length of four segments. The strip 12 is secured to the apparatus by the pilot pin 86, and the plating heads 80 and 80' are adjusted to predetermined plating positions four segments apart by the adjusting screws 84 and 84'. Each of the segments of the strip is plated twice, once by each of the plating heads 80 and 80'.

Figure 15:
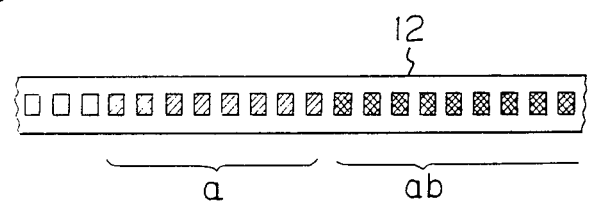
FIG. 15 is a schematic diagram of the strip which is plated according to the first embodiment.

In FIG. 15, symbol (a) denotes a portion that is plated by the plating head 80, and symbol (ab) denotes a portion that is plated twice by the plating heads 80 and 80'. According to this embodiment, therefore, in plating to a desired thickness is carried out the two seperate stages by two plating heads 80 and 80'. Therefore, the time required for plating in one (plating) cycle is reduced to one-half; i.e., the plating can be carried out at a high speed.

Figure 16:
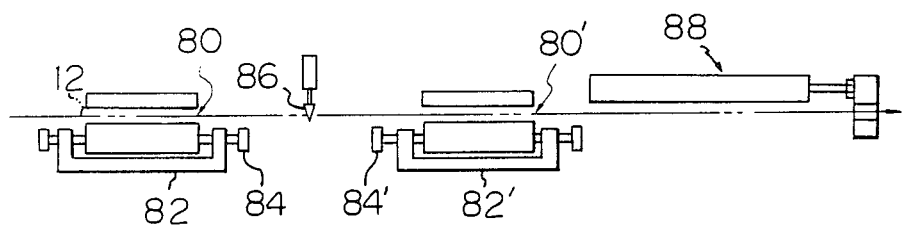
FIG. 16 is a schematic diagram illustrating a second embodiment of the arrangement of plating heads.
Figure 17:
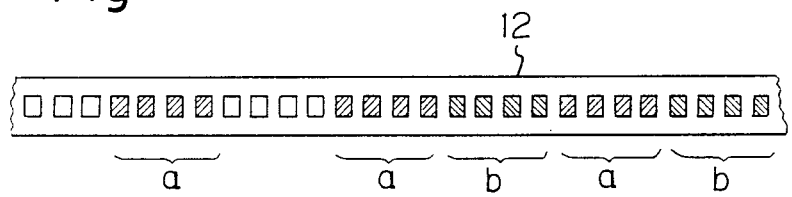
FIG. 17 is a schematic diagram of the strip which is plated according to the second embodiment.

In FIG. 16, also, the plating heads 80 and 80' of the same length are arranged in tandem in the lengthwise direction, and each plating head plates selectively onto a certain number of segments (in this case, we show four segments for explanation) of the strip 12 at the same time in one cycle. In this case, however, the plating heads 80 and 80' are spaced apart from each other by a distance which corresponds to eight segments and the strip 12 is fed by a stroke which corresponds to eight segments, which is twice the stroke in the case of FIG. 14. Namely, the strip 12 is plated alternately in groups of four segments by the plating heads 80 and 80'. In FIG. 17, symbol (a) denotes a portion that is plated by the plating head 80 and symbol (b) denotes a portion that is plated by the plating head 80'.

The latter embodiment, illustrated in FIGS. 16 and 17, has advantage over the former embodiment, illustrated in FIGS. 14 and 15, in the following aspects:

(1) Increased speed can be attained since the stroke of feeding the strip 12 in one cycle is twice of that in the former embodiment, although the required time for plating in one cycle is longer than that in the former embodiment.

(2) Accuracy of plating is higher in the latter embodiment than in the former embodiment, in which a secondary plate is superimposed over a primary plate, because it is almost impossible to position the secondary plate exactly over the primary plate due to some positioning discrepancy.

If the plating head was further elongated in order to increase the speed of the plating operation, the accuracy of the plating would be reduced because of non-negligible heat expansion of the plating head. The length of each plating head is thus limited. Therefore, by using two or more plating heads 80 and 80' as mentioned above, in the latter embodiment the number of slating segments for one plating cycle can be increased, i.e., by using n number of plating heads, the speed can be increased about n times compared to single head plating.

We claim:

1. A selective plating apparatus for selectively plating an elongated metal strip, stored on first and second reels, at intervals of a predetermined length in the lengthwise direction thereof, while the strip is being fed in the lengthwise direction thereof, said selective plating apparatus comprising:

strip discharge means for delivering the strip from the first reel in a direction in which the strip is fed, said strip discharge means comprising:

a drive motor, coupled to the first reel, for driving the first reel;

detecting means, disposed adjacent to the strip and operatively connected to said drive motor, for controlling said drive motor, said detecting means controlling said drive motor so that slack in the strip is formed following the first reel, the slack in the strip being within a predetermined range;

a pre-treating station, disposed following said strip discharge means in the direction in which the strip is fed, for providing continuous strip feeding and treating the strip before the strip is plated, the slack in the strip being formed between the first reel and the pre-treating station;

intermittent feeding means, disposed following said pre-treating station in the direction in which the strip is fed, for converting the continuous strip feeding into an intermittent strip feeding and the intermittent strip feeding into the continuous strip feeding;

a plating station, disposed following said pre-treating station in the direction in which the strip is fed, for selectively plating the strip while the strip is stopped during the intermittent strip feeding;

an after-treating station, disposed following said plating station in the direction in which the strip is fed, for treating the strip after the strip is plated;

strip take-up means, disposed following said after-treating station in the direction in which the strip is fed, for winding up the strip on the second reel after the strip has been treated;

tension mechanisms, one of said tension mechanisms disposed between said pre-treating and plating stations and another of said tension mechanisms disposed between said plating and after-treating stations, said tension mechanisms imparting a predetermined tensile force to the strip by passing the strip via at least one fixed roller and at least one tension roller having a position; and synchronizing means, operatively connected to said pre-treating and after-treating stations and said tension mechanisms, for synchronizing the continuous and intermittent strip feeding by detecting the position of the at least one tension roller.

2. A selective plating apparatus according to claim 1, wherein said detecting means comprises:

a noncontacting type detector, located at a predetermined position in the direction in which the strip is fed, for detecting the height of the strip and producing peak-wave signals having peaks;

two peak-holding circuits operatively connected to said noncontacting type detector, each of said peak-holding circuits storing the peaks of the peak-wave signals for one-half of a time interval, said peak-holding circuits producing outputs; and a pair of switches, operatively connected to said peak-holding circuits and said drive motor, for selectively switching the outputs of said peak-holding circuits.

3. A selective plating apparatus according to claim 1, wherein each of said tension mechanisms comprises:

first and second fixed rollers disposed at a predetermined distance from each other, each having an axis;

an arm, having a first end rotably mounted on the axis of said first fixed roller and a second end, said arm being allowed to swing about the axis of said first fixed roller; and a tension roller rotatably mounted on the second end of said arm, the strip running from said first fixed roller to said second fixed roller via said tension roller, said arm being biased about the axis of said first fixed roller with a predetermined force in a direction imparting the predetermined tensile force to the strip via said tension roller.

4. A selective plating apparatus according to claim 1, wherein said tension mechanism comprises:

two fixed rollers disposed at a predetermined distance from each other;

an arm having two ends and a fixed axis at a given point between said two fixed rollers, said arm swinging about the fixed axis; and two tension rollers, each of the tension rollers rotatably mounted on one of the ends of said arm, the strip running from one of said fixed rollers to the other of said fixed rollers via said two tension rollers, said arm being biased about the fixed axis with a predetermined force in a direction imparting the predetermined tensile force to the strip.

5. A selective plating apparatus according to claim 3 or 4, further comprising a pneumatic swinging mechanism, connected to said arm, generating the predetermined force in the direction imparting the predetermined tensile force to the strip.

6. A selective plating apparatus according to claim 1, wherein the at least one tension roller is linearly slidable and biased with a predetermined force in a direction imparting the predetermined tensile force to the strip.

7. A selective plating apparatus according to claim 1, wherein said synchronizing means provides the synchronizing by generating feedback controlling the continuous strip feeding in dependence upon the position of the tension roller in said tension mechanism within a predetermined range.

8. A selective plating apparatus according to claim 1, wherein the strip has a number of segments continously connected to each other in the lengthwise direction, and wherein said plating station comprises n number of plating heads, arranged in the length-wise direction of the strip, each of said plating heads having a length l and selectively plating onto a plurality of the segments of the strip at a time in one cycle, the strip being fed by a length of nl in one cycle and said plating heads being spaced apart from each other by a distance of nl.

* * * * *

UNITED STATES PATENT AND TRADEMARK OFFICE
CERTIFICATE OF CORRECTION

PATENT NO. : 4,553,501

DATED : November 19, 1985

INVENTOR(S) : HIROSHI KOBAYASHI ET AL.

It is certified that error appears in the above-identified patent and that said Letters Patent is hereby corrected as shown below:

```
57 [ABSTRACT], line 4, "includes" should be --includes a--.
Column 1, line 54, delete "," (second occurrence);
          line 65, after "therefore," insert --that--.
Column 2, line 15, after "strip" insert --discharge--;
          line 53, change "said" to --the--.
Column 3, line 63, "," should be --and--.
Column 4, line 19, after "illustrates" insert --an
embodiment of--;
          line 32, "theperiod" should be --the period--.
Column 5, line 35, "With" should be --In the--;
          line 65, "H," should be --H_1--.

Column 6, line 26, "H_1" should be --H_1 and--;

line 67, "1" should be --ℓ--.
Column 7, line 8, after "direction" insert --is denoted--.
Column 8, line 12, change "the" to --in--;
          line 53, delete ","; after "embodiment" insert
--,--.
```

Signed and Sealed this

Twenty-fifth Day of March 1986

[SEAL]

Attest:

DONALD J. QUIGG

Attesting Officer

Commissioner of Patents and Trademarks